United States Patent [19]
Itoh et al.

[11] Patent Number: 5,999,036
[45] Date of Patent: Dec. 7, 1999

[54] OUTPUT CIRCUIT WITH OUTPUT VOLTAGE CONTROLLED BY CURRENT FLOW THROUGH AN OUTPUT TRANSISTOR CIRCUIT

[75] Inventors: Naoki Itoh, Kanagawa-ken; Manabu Nakayama, Saga-ken, both of Japan

[73] Assignee: Kabushiki Kaisha Toshiba, Kawasaki, Japan

[21] Appl. No.: 08/892,974

[22] Filed: Jul. 15, 1997

[51] Int. Cl.[6] .......................... H03K 17/60; H03K 17/687
[52] U.S. Cl. .............................................. 327/432; 327/483
[58] Field of Search ..................................... 327/108, 112, 327/374, 427, 432, 434, 437, 478–483, 491, 575, 576, 587; 326/82, 83, 89

[56] References Cited

U.S. PATENT DOCUMENTS

| | | | |
|---|---|---|---|
| 4,393,337 | 7/1983 | Nagai et al. .............................. | 315/408 |
| 4,581,542 | 4/1986 | Steigerwald .............................. | 327/440 |
| 5,296,765 | 3/1994 | Williams et al. ......................... | 327/379 |
| 5,424,671 | 6/1995 | Hohne et al. ............................ | 327/483 |
| 5,489,861 | 2/1996 | Seymour .................................. | 327/108 |

*Primary Examiner*—My-Trang Nu Ton
*Attorney, Agent, or Firm*—Olbon, Spivak, McClelland, Maier & Neustadt, P.C.

[57] ABSTRACT

An output circuit including an input inverting buffer circuit, and an output transistor circuit controlling a voltage of an output terminal by a current flowing therein. A control terminal of the output transistor is coupled to an output of the buffer circuit and to a current divider. The current divider is controlled by a voltage level of the output terminal and diverts current flowing from the output of the buffer circuit to the output transistor. The output circuit reduces overcurrent that flows at a rise of a voltage level of an output terminal, and thereby prevents a ground voltage level from floating up and noise from occurring.

24 Claims, 7 Drawing Sheets

OUTPUT CIRCUIT WITH OUTPUT VOLTAGE CONTROLLED BY CURRENT FLOW THROUGH AN OUTPUT TRANSISTOR CIRCUIT

FIELD OF THE INVENTION

The present invention relates to an electronic circuit. More specifically, the present invention relates to an output circuit in an integrated circuit that reduces overcurrent generated during transitions of an output level of the output circuit.

BACKGROUND OF THE INVENTION

Figure 1:
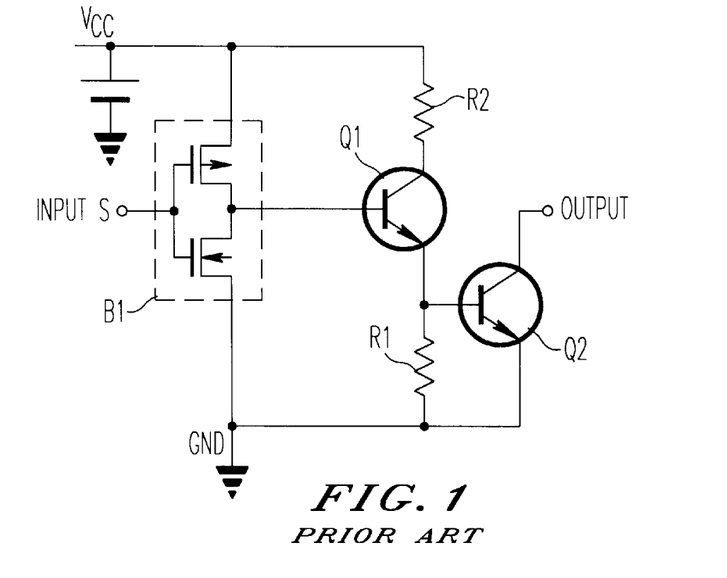
FIG. 1 is prior art illustrating a conventional output circuit.
Figure 2:
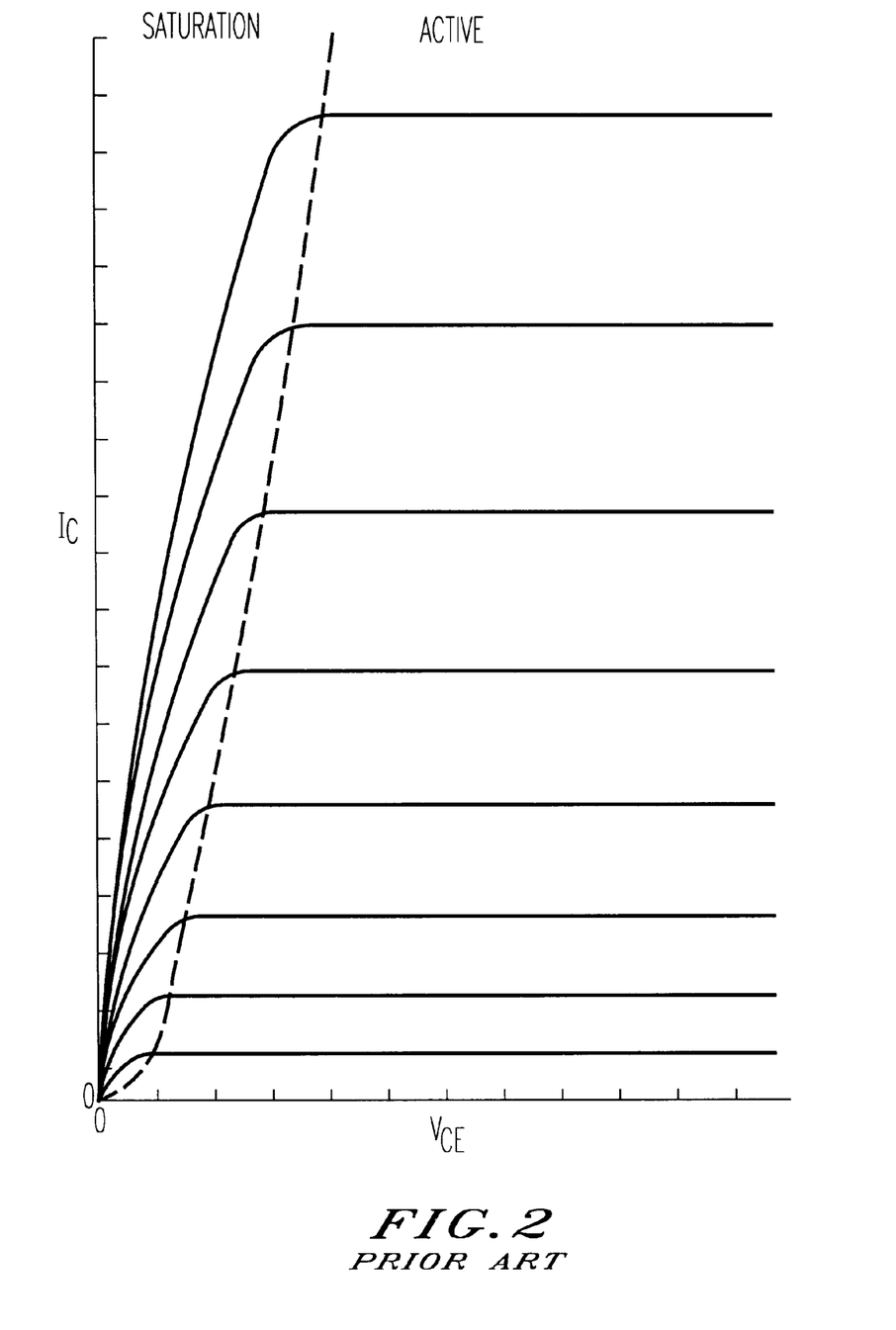
FIG. 2 is a prior art graph illustrating a characteristic curve of a conventional transistor.

FIG. 1 shows a conventional output circuit arranged in an integrated circuit. FIG. 2 is a Figure showing the characteristics of transistors Q1 and Q2 of the integrated circuit. An input signal S generated in a separate integrated circuit is supplied via a buffer B1 to a base of NPN transistor Q1. A collector of the transistor Q1 is connected via a resistance R2 to a power voltage source. An emitter of the transistor Q1 is connected via a resistance R1 to a ground GND, and also connected to a base of NPN transistor Q2. An emitter of the transistor Q2 is connected to the ground GND, and a collector of the transistor Q2 is connected to an output terminal, to which an external load is connected.

Figure 3A:
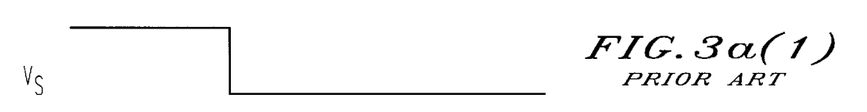
FIG. 3(a) is a timing diagram of the conventional output circuit of FIG. 1.
Figure 3B:
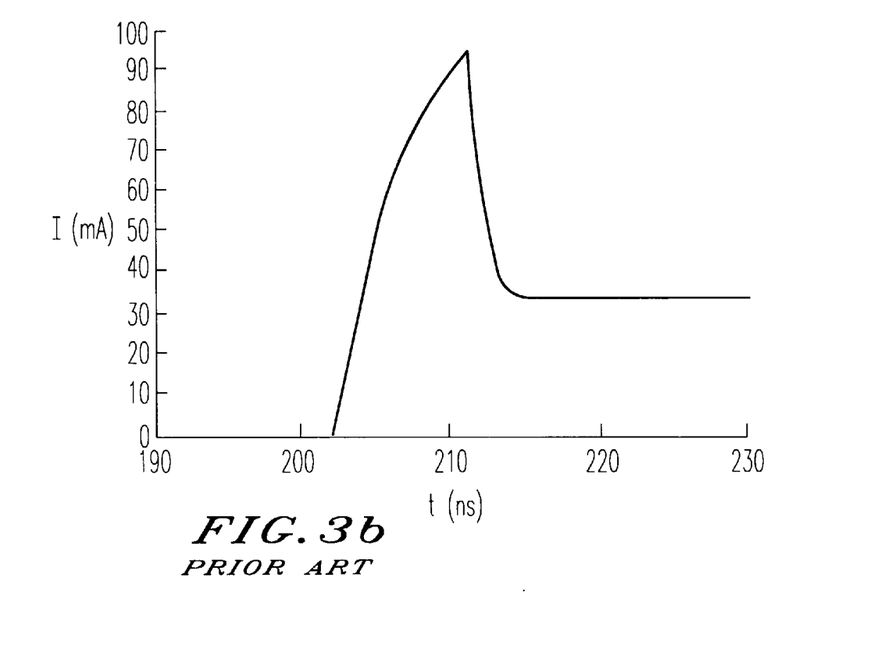
FIG. 3(b) is a graph illustrating current flowing through a transistor Q2 in the conventional output circuit of FIG. 1.

In this open collector circuit, the transistor Q2 is designed to operate in a saturation range as shown in FIG. 2. FIG. 3(a) is a timing chart of $V_S$ (voltage of input signal S), $V_{Q1B}$ (base voltage of transistor Q1), $I_{Q1E}$ (emitter current of transistor Q1), $V_O$ (voltage of the output terminal) and $I_{Q2C}$ (collector current of transistor Q2). FIG. 3(b) is an enlarged Figure of a graph of current versus time for a part of $I_{Q2C}$. This has been obtained by simulation. As seen in FIGS. 3(a) and 3(b), $I_{Q2C}$ has a maximum value when $V_S$ rises. The reason for this maximum is described below.

An initial status of the transistor Q2 is in an active range, and until the transistor transitions from the active range to a saturation range, a current, that is a product of the base current of the transistor Q1 and the square of $H_{fe}$ (current amplification factor of transistors Q1 and Q2), runs through the transistor Q2.

Accordingly, when input signal S transitions from a high level to a low level and the voltage level of the output terminal rises, since the transistor Q2 is in the active range, an overcurrent of $h_{fe}$ times the base current of the transistor Q2 runs through the transistor Q2. This overcurrent causes the voltage level of the ground to float up, generating noise, which is a problem in the prior art.

SUMMARY OF THE INVENTION

The present invention has been made in consideration of the above problem in the prior art, therefore, the object of the present invention is to reduce the overcurrent that flows at the rise of an output circuit, and thereby prevent the voltage level of the ground from floating up and noise from occurring.

To achieve the above object, the present invention provides an output circuit which comprises a buffer means for inverting an input signal, an output transistor controlling a voltage of an output terminal by a current flowing therein, a control terminal of the output transistor is coupled to an output of the buffer means, and a current dividing means controlled by the voltage, dividing a current flowing from the output of the buffer means.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained as the same becomes better understood by reference to the following detailed description considered in connection with the accompanying drawings, wherein.

DETAILED DESCRIPTION OF THE PREFERRED EMBODIMENTS

Figure 4:
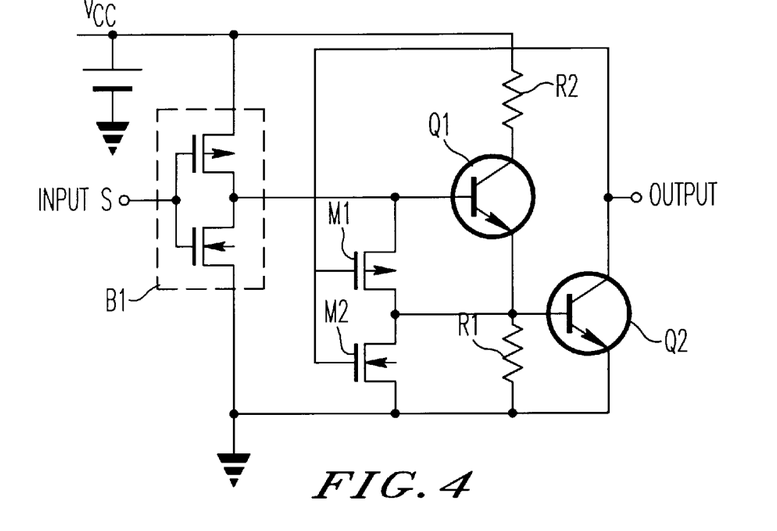
FIG. 4 is a circuit diagram illustrating a first embodiment of the present invention.

Referring now to the drawings, wherein like reference numerals designate identical or corresponding parts throughout the several views, and more particularly to FIG. 4 thereof, a circuit diagram of the first embodiment of the present invention is illustrated. The circuit shown in FIG. 4 includes P channel transistor M1 and N channel transistor M2 added to an output circuit including NPN transistors Q1 and Q2.

Input signal S, generated in a separate integrated circuit, is supplied via a buffer (CMOS inverter) B1 to the base of transistor Q1. The collector of transistor Q1 is connected via a resistance R a power voltage source VCC, and the base of the transistor Q1 is further connected to the source of P channel transistor M1.

The drain of the transistor M1 is connected to the base of transistor Q2, and the gate of the transistor M1 is connected to the collector of transistor Q2. The drain of N channel transistor M2 is connected to the base of the transistor Q2, the source of transistor M2 is connected to ground, and the gate of the transistor M2 is connected to the collector of transistor Q2. The emitter of transistor Q1 is connected via a resistance R1 to the ground, and is also connected to the base of transistor Q2. The emitter of transistor Q2 is connected to the ground, and the collector of transistor Q2 is connected to an output terminal. To the output terminal, an external load is connected (not shown).

In the circuit of FIG. 4, when the input signal S is at a high level, the transistors Q1 and Q2 are off, and the output terminal is at a high level. Since the output terminal is at a high level, even though the transistor M2 is on, the transistors M1 and Q1 are off, and current does not flow through the transistor M2. Consequently, when the input signal S is at a high level, the circuit shown in FIG. 4 acts in a similar manner as the conventional circuit shown in FIG. 1.

As the input signal S transitions from a high level to a low level, the transistor Q2 is turned on and begins operating in the active range shown in FIG. 2. In the conventional circuit, emitter current of the transistor Q1 directly becomes the base current of the transistor Q2, and the current that flows through the transistor Q2 equals the product of the base current of the transistor Q1 and the square of $H_{fe}$. However, in the present embodiment, when the collector voltage level of the transistor Q2, i.e., a voltage level of the output terminal, starts to drop, the transistor M2 is on, and the emitter current of the transistor Q1 flows through the transistor M2. Therefore, the base current of the transistor Q2 is reduced, thereby reducing the collector current of the transistor Q2. This is because the collector current of the transistor Q2 is equal to the product of the base current of the transistor Q2 and $h_{fe}$.

When the voltage level of output terminal, i.e., the collector voltage level of the transistor Q2 goes down, the transistor M2 is turned off, and the transistor M1 is turned on. When the transistor M1 is on, current that would otherwise be supplied to the base of the transistor Q1 flows via the transistor M1 directly to the base of the transistor Q2.

Therefore, the transistor Q1 is off, and the current flowing through transistor Q2 (expected base current of transistor Q1) is the product of the current of the current flowing through transistor M1 to the base of transistor Q2 and $h_{fe}$. Accordingly, the rise of the current flowing through the transistor Q2 is moderated. And further, because the voltage level of the output terminal has already lowered to some extent as a result of transistor M1 being turned on, the maximum value of the current flowing through the transistor Q2 is lower than that of a conventional output circuit.

Figure 5:
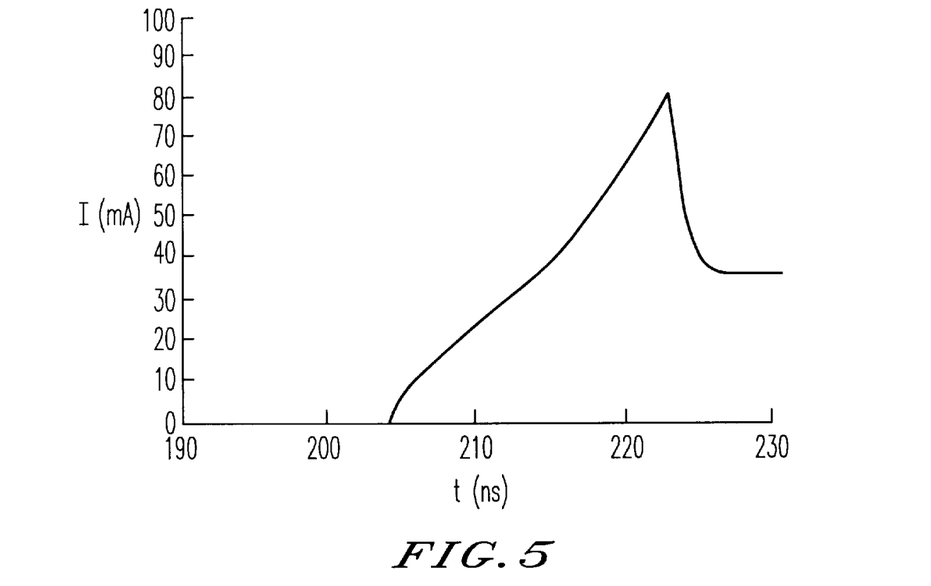
FIG. 5 is a graph illustrating current flowing through the transistor Q2 in the first embodiment.

FIG. 5 shows a waveform of the current flowing through the transistor Q2 in accordance with a high-low transition of inputted signal S in this embodiment. FIG. 5 was obtained by simulation. With respect to a change of inclination in a course of rise of the waveform, it is considered that the change of inclination represents a moment when transistor M1 is turned on and transistor M2 is turned off. By comparison with the simulation results for the conventional circuit shown in FIG. 2, it is recognized that the maximum current has been reduced.

Thus, the insertion of the transistors M1 and M2 enables division of the base current of the transistor Q2 at the moment the voltage level of the output terminal begins to drop, thereby reducing the maximum current. And when the transistor Q2 reaches the saturation range, voltage equal to a product of an ON-state resistance of the transistor M1 and a current flowing through the transistor M1 is input to the base of transistor Q1, turning transistor Q1 on. Therefore, when the transistor Q2 reaches the saturation range, the circuit of this embodiment acts in a similar manner as the conventional circuit shown in FIG. 1.

In an alternative configuration, the collector of transistor Q1 may be connected directly to the power voltage source instead of through resistance R2. Furthermore, even without the resistance R2, it is possible to obtain an effective reduction of the peak current in transistor Q2.

Figure 6A:
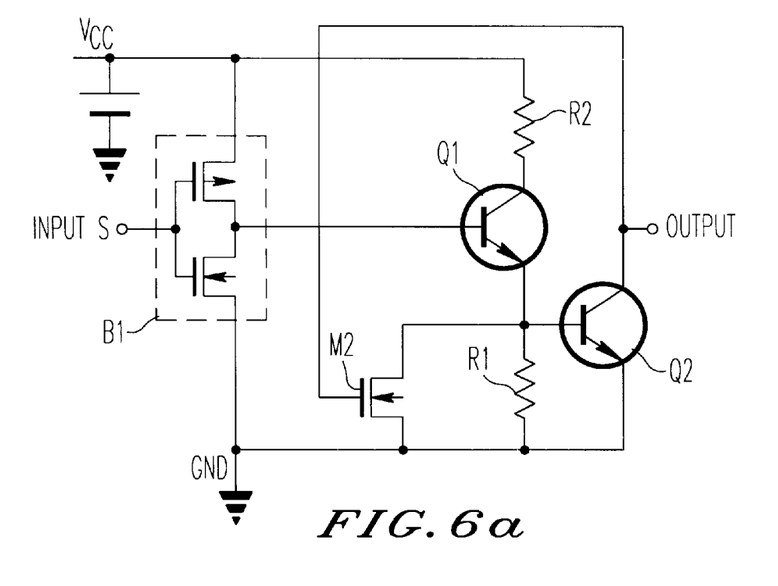
FIG. 6(a) is a circuit diagram illustrating a second embodiment of the present invention.
Figure 6B:
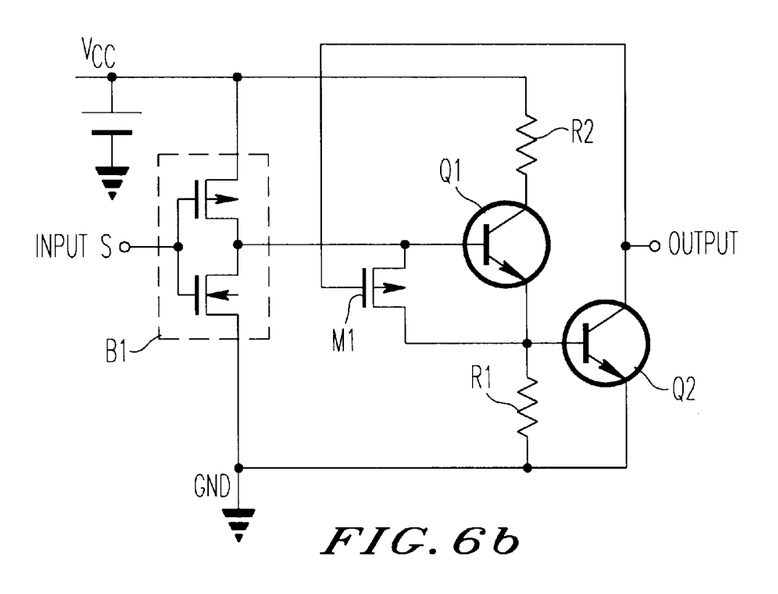
FIG. 6(b) is a circuit diagram illustrating an alternative configuration of the second embodiment.

FIGS. 6(a) and 6(b) represent the second embodiment of the present invention. Hereinafter, explanations of like components (assigned corresponding reference numerals) are omitted. FIG. 6(a) illustrates a circuit where the transistor M1 is removed from the circuit shown in FIG. 4, and FIG. 6(b) illustrates a circuit where the transistor M2 is removed from the circuit shown in FIG. 4.

In the circuit shown in FIG. 6(a), since the transistor M2 is turned on at the moment the voltage level of the output terminal begins to drop, most of the emitter current of the transistor Q1 flows through the transistor M2 toward ground, and only part of it flows to the base of transistor Q2. As a consequence, the collector current of the transistor Q2 is reduced at the moment the voltage level of output terminal begins to drop.

In the circuit shown in FIG. 6(b), when the voltage level of the output terminal drops, lowering the collector voltage level of transistor Q2, the transistor M1 is turned on. Therefore, current that would otherwise be supplied to the base of transistor Q1 flows via the transistor M1 directly to the base of transistor Q2. As a result, the collector current of the transistor Q2 is reduced.

In the circuits shown in FIGS. 6(a) and 6(b), when the input signal is at a high level or at a low level, the circuits function the same as the circuit shown in FIG. 1.

Figure 7:
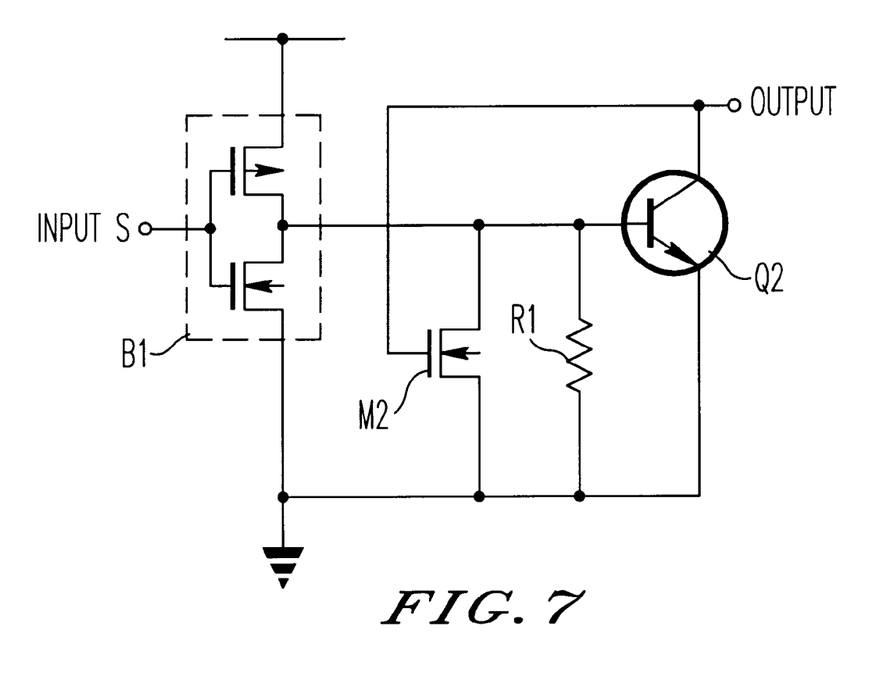
FIG. 7 is a circuit diagram illustrating a third embodiment of the present invention.

FIG. 7 illustrates the third embodiment of the present invention. While the first embodiment shown in FIG. 4 applies the current dividing means comprising M1, M2, or M1 and M2 to an open collector circuit of darlington connection, this embodiment applies the current dividing means to an open collector circuit comprising only a single transistor.

Namely, for instance, the input signal S generated in a separate integrated circuit is supplied via buffer B1 to the base of NPN transistor Q2. The drain of N channel transistor M2 is also connected to the base of the transistor Q2, the source of the transistor M2 is connected to ground, and the gate of the transistor M2 is connected to the collector of transistor Q2. The base of transistor Q2 is further connected via a resistance R1 to the ground. The emitter of the transistor Q2 is connected to the ground, and the collector of transistor Q2 is connected to the output terminal. An external load is connected to the output terminal (not shown).

In this third embodiment, because the transistor M2 is on at the moment the voltage level of the output terminal begins to drop, most of inverted input signal S flows through the transistor M2 and only part thereof flows to the base of transistor Q2. As a consequence, the collector current of transistor Q2 is reduced at the moment the voltage level of the output terminal begins to drop.

Figure 8A:
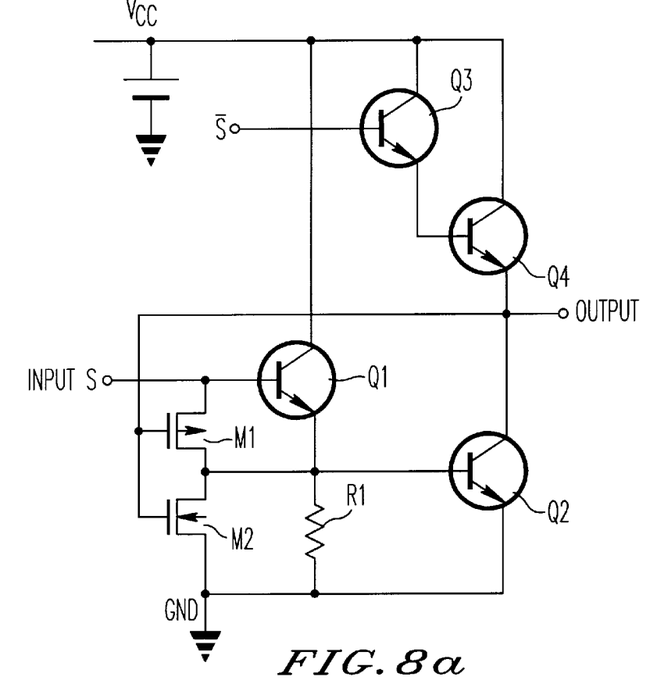
FIG. 8(a) is a circuit diagram illustrating a fourth embodiment of the present invention.
Figure 8B:
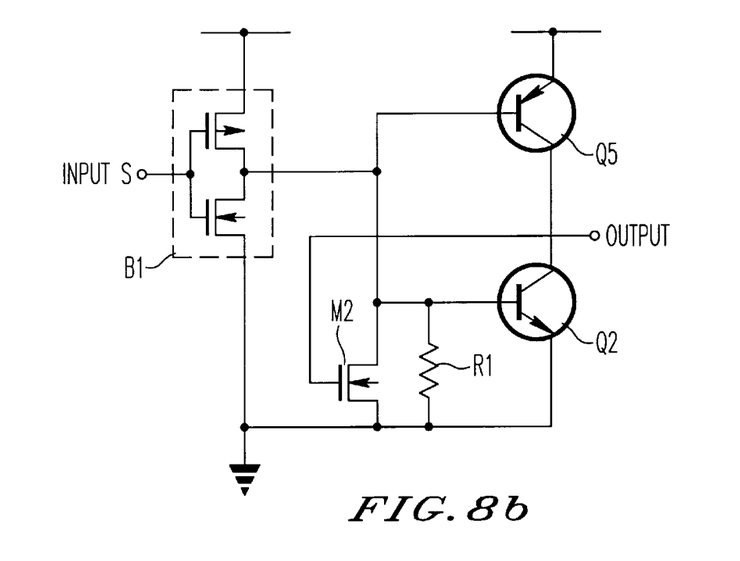
FIG. 8(b) is a circuit diagram illustrating an alternative configuration of the fourth embodiment.

FIGS. 8(a) and 8(b) illustrate the fourth embodiment according to the present invention.

FIG. 8(a) shows an example of a circuit wherein the present invention is applied to an output circuit of NPN transistors Q1 and Q2, being coupled by a darlington connection, and configured as a push-pull circuit. The input signal S is supplied to the base of transistor Q1. The collector of transistor Q1 is connected to the power voltage source VCC.

A source of P channel transistor M1 is connected to the base of the transistor Q1, the drain of transistor M1 is connected to the base of transistor Q2, and the gate of transistor M1 is connected to the collector of the transistor Q2. A drain of N channel transistor M2 is connected to the base of transistor Q2, the source of transistor M2 is connected to ground, and the gate of transistor M2 is connected to the collector of transistor Q2. The emitter of transistor Q1 is connected to the ground via a resistance R1, and is also connected to the base of transistor Q2. The emitter of the transistor Q2 is connected to the ground, while the collector of transistor Q2 is connected to an output terminal.

A reverse signal $\overline{S}$, of the signal S, is supplied to a base of an NPN transistor Q3, and the collector of transistor Q3 is connected to the power voltage source VCC, and the emitter of transistor Q3 is connected to a base of a transistor Q4. The collector of transistor Q4 is connected to the power voltage source VCC, and the emitter of transistor Q4 is connected to the output terminal. An external load is connected to the output terminal (not shown).

The circuit shown in FIG. 8(a) acts similarly to the circuit shown in FIG. 4 at a moment when a level of the input signal S begins to drop, therefore reducing the peak current flowing through the transistor Q2 at that moment.

FIG. 8(b) shows a circuit wherein a PNP transistor Q5 is arranged between the output terminal and the power voltage source VCC of the circuit shown in FIG. 7. Namely, the base of transistor Q5 is connected to the output of the buffer B1, the collector of transistor Q5 is connected to the power voltage source VCC, and the emitter of transistor Q5 is connected to the output terminal.

The circuit shown in FIG. 8(b) acts the same as the circuit shown in FIG. 7 at the moment when the level of the input signal S begins to drop, therefore, reducing the peak current flowing through the transistor Q2 at that moment.

In this manner, the present invention may be applied to not only an open collector circuit but also other output circuits such as push-pull circuits and so forth. The present invention is not limited to the embodiments mentioned above, but may involve, for example, a circuit wherein a resistance in the place of the transistor Q5 shown in FIG. 8(b) is arranged between the output terminal and the power voltage source.

As described heretofore, according to the present invention, the current, supplied to the base of an output transistor at the moment the level of the signal S begins to be lowered, is reduced. Accordingly, it is possible to reduce the overcurrent that flows through an output transistor at that moment, and thereby prevent the voltage level of the ground from floating up and noise from occurring.

Obviously, numerous modifications and variations of the present invention are possible in light of the above teachings. It is therefore to be understood that within the scope of the appended claims, the invention may be practiced otherwise than as specifically described herein.

What is claimed is:

1. An output circuit comprising:
   an inverting input buffer circuit having an output;
   an output transistor circuit controlling a voltage of an output terminal by a current flowing through the output transistor circuit, said output transistor circuit having a control terminal coupled to the output of the buffer circuit; and
   a current divider including a transistor whose gate is coupled to the output terminal, said current divider being controlled by the voltage of the output terminal so as to divide a current flowing from the output of the buffer circuit.

2. The output circuit according to claim 1, wherein the buffer circuit comprises a CMOS inverter.

3. The output circuit according to claim 1, wherein said output transistor circuit comprises, a first transistor having a base coupled to the output of the buffer circuit and a collector coupled to a power voltage source, and
a second transistor having,
a base coupled to an emitter of the first transistor,
a collector coupled to the output terminal, and
an emitter coupled to ground.

4. The output circuit according to claim 3, wherein:
the current divider comprises,
a first MOSFET having,
a gate coupled to the output terminal,
a drain coupled to the base of the second transistor, and
a source coupled to the output of the buffer circuit, and
a second MOSFET having,
a gate coupled to the output terminal,
a drain coupled to the base of the second transistor, and
a source coupled to ground.

5. The output circuit according to claim 3, wherein:
the current divider comprises,
a MOSFET having,
a gate coupled to the output terminal,
a drain coupled to the base of the second transistor, and
a source coupled to the output of the buffer circuit.

6. The output circuit according to claim 3, wherein:
the current divider comprises,
a MOSFET having,
a gate coupled to the output terminal,
a drain coupled to the base of the second transistor, and
a source coupled to ground.

7. The output circuit according to claim 1, wherein the current divider is released from dividing the current after the output transistor circuit reaches a saturation range.

8. The output circuit according to claim 1, wherein:
the output transistor circuit comprises a first transistor having,
a base coupled to the output of the buffer circuit,
a collector coupled to the power voltage source, and
an emitter coupled to ground, and a second transistor having,
a base coupled to the emitter of the first transistor,
a collector coupled to the output terminal, and
an emitter coupled to ground.

9. The output circuit according to claim 8, wherein:
the current divider comprises a MOSFET having,
a gate coupled to the output terminal,
a drain coupled to the base of the output transistor, and
a source coupled to ground.

10. An output circuit comprising:
a first transistor, comprising,
a base coupled to a first input terminal,
a collector coupled to a power voltage source, and
an emitter coupled to ground;
a second transistor, comprising,
a base coupled to the emitter of the first transistor,
a collector coupled to an output terminal, and
an emitter coupled to ground;
a third transistor, comprising,
a base coupled to a second input terminal, and
a collector coupled to the power voltage source;
a fourth transistor, comprising, a base coupled to an emitter of the third transistor, a collector coupled to the collector of the third transistor, and an emitter coupled to the output terminal;

a first MOSFET, comprising, a gate coupled to the output terminal, a drain coupled to the base of the second transistor, and a source coupled to the first input terminal; and a second MOSFET, comprising, a gate coupled to the output terminal, a drain coupled to the base of the second transistor, and a source coupled to ground.

11. An output circuit comprising:

a CMOS inverter coupled to an input terminal;

a first transistor, comprising,
 a base coupled to an output of the CMOS inverter,
 a collector coupled to a power voltage source terminal, and
 an emitter coupled to ground;

a second transistor, comprising,
 a base coupled to the emitter of the first transistor,
 a collector coupled to the output terminal, and
 an emitter coupled to ground; and a MOSFET, comprising,
 a gate coupled to the output terminal,
 a source coupled to ground, and
 a drain coupled to the base of the second transistor.

12. An output circuit comprising:

a first transistor coupled to an output terminal and ground;

a second transistor coupled to a base of the first transistor and a power voltage source, the first transistor and the second transistor forming a darlington coupling;

a first switch coupled to the base of the first transistor and ground, for dividing current flowing to the base of the first transistor when a voltage level of the output terminal begins to drop; and a second switch coupled to the base of the first transistor and a base of the second transistor, for dividing current flowing to the base of the second transistor when a voltage level of the output terminal drops.

13. The output circuit according to claim 12, wherein:

said first switch comprises a NPN transistor; and said second switch comprises a PNP transistor.

14. The output circuit according to claim 13, further comprising a third transistor and a fourth transistor forming a second darlington coupling that is coupled to the output terminal and the power voltage source;

wherein the first transistor, the second transistor, the third transistor, and the fourth transistor form a pushpull circuit.

15. The output circuit according to claim 12, further comprising:

a resistance coupled between the base of the first transistor and ground.

16. An output circuit comprising:

a pair of Darlington coupled transistors having an output coupled to an output terminal; and a switch coupled to the pair of Darlington coupled transistors wherein one terminal of the switch is coupled to the output terminal, said switch being configured to reduce current flowing to an input of the pair of Darlington coupled transistors when a voltage level of the output terminal begins to drop.

17. The output circuit according to claim 16, wherein the switch is released from reducing current flowing to the input of the pair of Darlington coupled transistors after the voltage level of the output terminal has stopped dropping.

18. The output circuit according to claim 16, wherein the switch comprises a NPN transistor.

19. The output circuit according to claim 16, further comprising:

a resistance coupled between the base of the transistor and ground.

20. An output circuit comprising:

a first transistor coupled to an output terminal and ground;

a second transistor coupled to a base of the first transistor and a power voltage source, the first transistor and the second transistor forming a darlington coupling; and a switch coupled to the base of the first transistor and a base of the second transistor, configured to reduce current flowing to the base of the second transistor when a voltage level of the output terminal drops.

21. The output circuit according to claim 20, wherein the switch is released from reducing current flowing to the base of the second transistor after the voltage level of the output terminal has stopped dropping.

22. The output circuit according to claim 20, wherein the switch comprises a PNP transistor.

23. The output circuit according to claim 20, further comprising:

a resistance coupled between the base of the first transistor and ground.

24. An output circuit comprising:

a CMOS inverter coupled to an input terminal;

a first transistor, comprising,
 a base coupled to an output of the CMOS inverter,
 a collector coupled to a power voltage source terminal, and
 an emitter coupled to ground;

a second transistor, comprising,
 a base coupled to the emitter of the first transistor,
 a collected coupled to the power voltage supply terminal, and
 an emitter coupled to ground; and a MOSFET, comprising,
 a gate coupled to the output terminal,
 a source coupled to an output of the CMOS inverter, and
 a drain coupled to the base of the second transistor.

* * * * *